United States Patent [19]

Nath

[11] Patent Number: 5,280,133
[45] Date of Patent: Jan. 18, 1994

[54] JUNCTION BOX FOR A SOLAR PANEL

[75] Inventor: Prem Nath, Rochester Hills, Mich.

[73] Assignee: United Solar Systems Corporation, Troy, Mich.

[21] Appl. No.: 808,158

[22] Filed: Dec. 13, 1991

[51] Int. Cl.$^5$ .................... H05K 5/00; H05K 1/00; H01L 25/00; B29B 13/00

[52] U.S. Cl. .................... 174/52.1; 264/272.11; 136/251; 439/59; 439/62; 361/730; 361/736; 361/752

[58] Field of Search ............... 361/392, 394, 399, 419, 361/395; 174/52.1, 52.2; 136/251; 439/59, 60, 61, 62; 264/239, 271.1, 272.11

[56] References Cited

U.S. PATENT DOCUMENTS

| 3,427,459 | 2/1969 | Truffert | 136/251 |
|---|---|---|---|
| 3,671,917 | 6/1972 | Ammon et al. | 439/62 |
| 3,858,957 | 1/1975 | Harwood et al. | 439/59 |
| 4,532,372 | 7/1985 | Nath | 136/256 |
| 4,590,327 | 5/1986 | Nath | 136/256 |
| 4,598,306 | 7/1986 | Nath | 357/30 |
| 4,617,421 | 10/1986 | Nath | 136/244 |
| 4,633,033 | 12/1986 | Nath | 136/256 |
| 4,633,034 | 12/1986 | Nath | 136/256 |
| 4,773,944 | 9/1988 | Nath | 136/249 |

FOREIGN PATENT DOCUMENTS

| 61-82484 | 4/1986 | Japan | 136/251 |
|---|---|---|---|
| 62-152183 | 7/1987 | Japan | 136/251 |

Primary Examiner—Leo P. Picard
Assistant Examiner—Bot Ledynh
Attorney, Agent, or Firm—Krass & Young

[57] ABSTRACT

A solar panel assembly (10) includes a power generating sheet (22) having two output terminals (30,32), and an electric cable (20) soldered at one end to terminals (30) and (32). A frame member is anchored to the solar panel in overlying relation to the terminals and an epoxy material (62) fills a cavity (58) defined by the frame member (40). A case (42) covers the frame member (40). The case includes an upper member (44) and a lower member (46) which are snap fitted together through apertures in the solar panel. The case (42) includes a tension relieving device which prevents tension on the cable (20) from being transferred to the cable end connected to the terminals (30) and (32). The epoxy provides a water resistant seal which allows the solar panel to be used in hostile environments.

22 Claims, 4 Drawing Sheets

JUNCTION BOX FOR A SOLAR PANEL

TECHNICAL FIELD

This invention relates generally to photovoltaic devices and more particularly to a junction box for use with a flat photovoltaic solar panel.

BACKGROUND OF THE INVENTION

The increasing scarcity, and the realization of the ecological and safety problems associated with non-renewable energy reserves such as coal petroleum and uranium, have made it essential that increased use be made of alternate non-depletable energy resources such as photovoltaic energy. Photovoltaic energy use has been limited in the past to special application due in part to the high cost of manufacturing devices capable of producing significant amounts of photovoltaic energy. The development of a continuous process that continuously deposits successive layers of amorphous semiconductor alloy material on an elongated substrate to fabricate photovoltaic devices in mass production has greatly promoted the use of photovoltaic energy.

One particular application in which photovoltaic devices have been found practical is in marine environments such as on piers and on non-motorized boats such as sailboats. In a typical marine application, a photovoltaic solar panel is utilized to recharge a battery on board the non-motorized boat. While the solar panel itself is typically manufactured with a plastic cover that makes the solar panel water and weather resistant, the junction between the electric cable for connection to the battery and the solar panel must also be made waterproof and structurally secure against pulling and other tension exerted on the electric cable. If the junction at the terminal is not waterproof the water may short out the solar panel and cause corrosion to proceed into the solar panel. It has been proposed to position the junction box beneath the solar panel to provide protection from the elements but this arrangement makes it impossible to mount the panel flat and flush against a boat surface.

What is needed is a solar panel that can be used in a marine environment and which can be substantially flat, flush mounted on a suitable surface. More particularly, what is needed is a low profile junction box that is used to connect an electric cable to a solar panel to form a durable and waterproof connection between the electric cable and the solar panel.

SUMMARY OF THE INVENTION

This invention relates to a solar panel of the type including a power generating sheet that has an electrically conductive substrate and a plurality of layers of semi-conductive alloy material adhered to the substrate to form at least one photovoltaic cell. The power generating sheet is laminated between water resistant sealing material such as sheets of plastic and the upper laminated layer of plastic is transparent to allow light to reach the photovoltaic material.

According to the invention, an improved junction box is provided for connecting the output terminals of the solar panel to an electric cable. The invention junction box is positioned on a side edge of the solar panel beyond the peripheral edge of the photovoltaic material. The junction box includes a case having a first member and a second member adapted to be clamped about an insulating border of the solar panel forming a side edge portion of the solar panel. Within the case a water sealant material, such as an epoxy, is adhered about a soldered connection between the electric cable and the solar panel terminals.

In the preferred embodiment, a frame member having an enclosing border configuration is anchored to the solar panel within the case. The frame member has a notch which allows the electric cable to extend therethrough. The frame member is positioned in overlying, surrounding relation to the solar panel terminals and the epoxy is positioned within the frame member and allowed to set therein. After the epoxy has set, the case is positioned over the frame member and snap fitted thereto.

The case also has a tension relief device whereby tension forces applied to the cable outside of the case are not transferred to the cable at the terminals.

The case has a height that is substantially less than its width or length such that it has a low profile perpendicular to the plane of the solar panel.

In the preferred embodiment, the insulating border of the solar panel is also laminated between the weather resistant sheets of plastic, and anchor apertures extend through the border in proximity to each corner of the solar panel to facilitate mounting the solar panel on a suitable surface.

The invention also provides a method of establishing a sealed connection between a solar panel having output terminals and an electric cable. The invention method includes the steps of connecting one end of the cable to the output terminals; potting the one cable end in a quantity of potting material overlying and sealing the terminals; and positioning a junction box over the potting material with the electric cable extending out of the junction box through an aperture in the junction box.

According to a further aspect of the invention methodology, the potting step comprises placing a frame member having an encircling border configuration over the terminals with the one end of the cable extending into the area enclosed by the frame for connection to the solar panel terminals and placing the potting material within the frame member in surrounding relation to the end of the cable connected to the terminal.

According to a further feature of the invention methodology, the potting step further comprises placing an anchor plate beneath the terminals and coupling the frame member to the anchor plate by coupling means passing through the solar panel in surrounding relation to the solar panel terminals.

DETAILED DESCRIPTION OF THE PREFERRED EMBODIMENT

Figure 1:
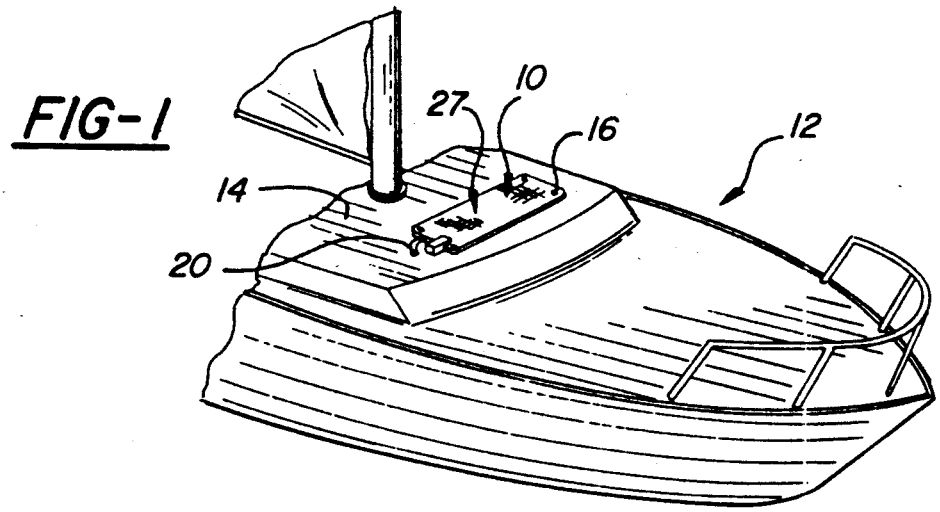
FIG. 1 illustrates a solar panel and junction box according to the invention with the solar panel shown mounted on a sailboat.
Figure 2:
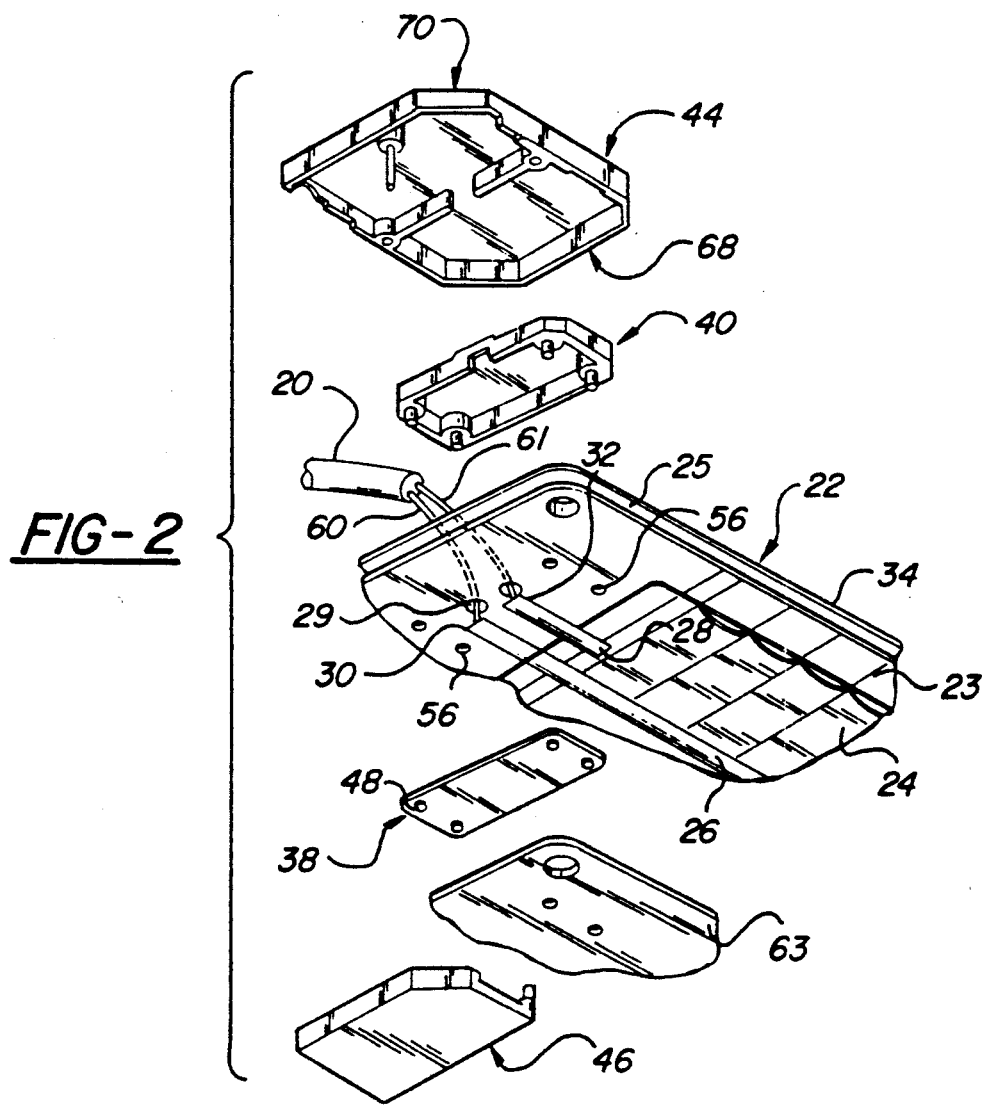
FIG. 2 is an exploded view of the solar panel and junction box of FIG. 1.

Referring to FIG. 1, a solar panel assembly 10 is adapted for use on a sailboat 12 or other marine environment. The solar panel assembly 10 can be mounted on a canopy or roof 14 of the sailboat by means of hooks 16 passing through eyelets 18 positioned near the corners 19 of the solar panel assembly 10.

Solar panel assembly 10 includes a solar panel 27 and an electric cable 20 extending from the solar panel for connection to an electric device on the sailboat such for example as a storage battery.

Solar panel 27 includes a photovoltaic sheet 22, a border 25 of insulated material surrounding the photovoltaic sheet, a top weather resistant sheet 34, and a bottom weather resistant sheet 23. Photovoltaic sheet 22 is formed by depositing multiple layers of a silicon alloy material on an elongated metallic substrate 24. Sheet 22 includes positive and negative bus bars 26 and 28 terminating in positive and negative terminals 30 and 32. Bus bars 26 and 28 extend laterally beyond the periphery of the photovoltaic sheet in underlying relation to border 25 so that terminals 30 and 32 are also positioned beneath border 25. Top weather resistant sheet 34 is formed of a transparent plastic material such as Tefzel TM and is laminated over the photovoltaic sheet 22 and border 25. Lower sheet 23 is laminated underneath photovoltaic sheet 22 and border 25 and coacts with top sheet 34 to protect the bus bars 26, 28, sheet 22, and border 25 from the elements.

Electric cable 20 is connected to terminals 30 and 32 proximate one end edge of the solar panel 27. Access apertures 29 extend through border 25 and top plastic sheet 34 and cable 20 has positive and negative leads 60 and 62 which extend through access apertures 29 for soldering connection to terminals 30 and 32, respectively.

For applications in hostile environments, such as marine environments, it is critical that the terminals 30 and 32 be sealed to prevent hostile elements such as salt water from seeping from the terminals beneath the weather resistant sheet 34 and 23 to attack photovoltaic sheet 22. To address this need, a junction box generally indicated at 36 is connected about the terminals 30 and 32 to provide a durable and weather resistant junction between cable 20 and terminals 30 and 32.

Junction box 36 includes an anchor plate 38, a frame member 40, and a case 42. Case 42 includes an upper case member 44 and a lower case member 46.

Anchor plate 38 comprises a thin metal plate having four apertures 48 passing through embossments 47.

Figure 10:
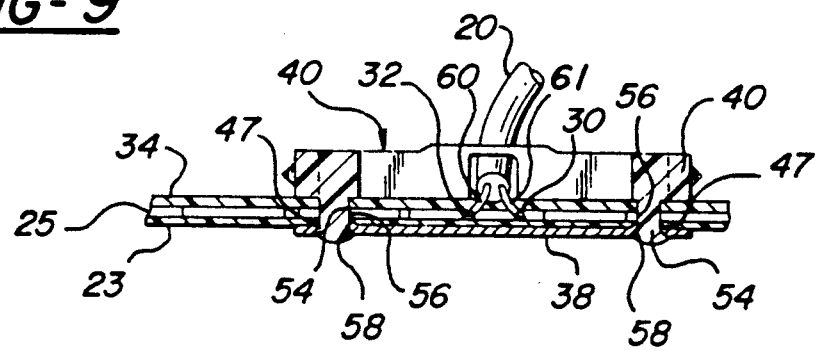
FIG. 10 is a cross sectional view of a partially assembled junction box.
Figure 3:
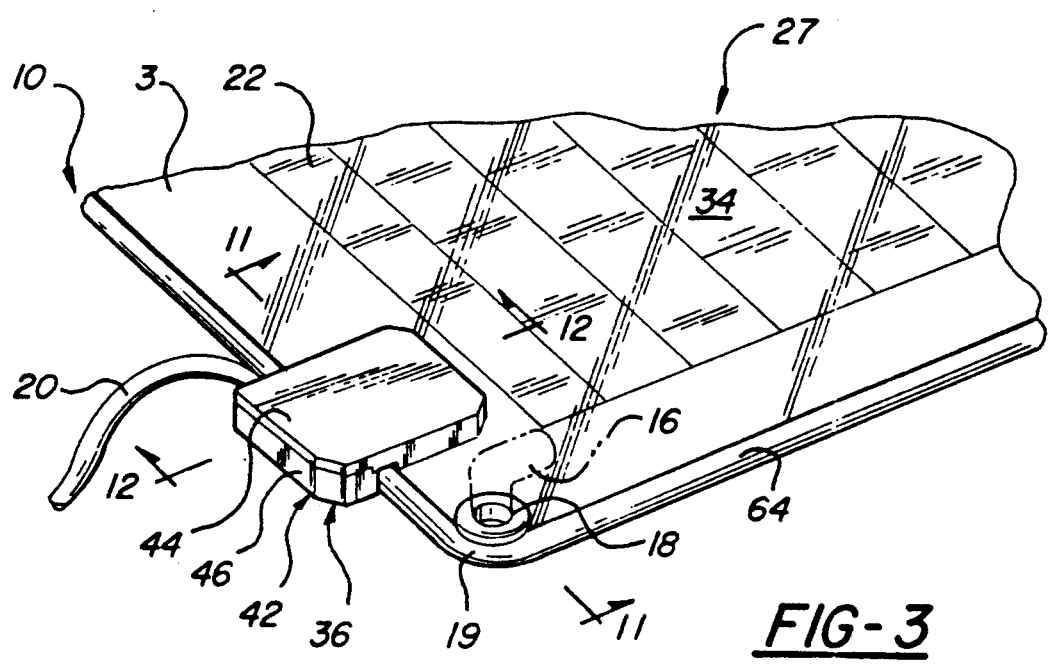
FIG. 3 is an enlarged, perspective, fragmentary view of the solar panel and junction box of FIG. 1.
Figure 4:
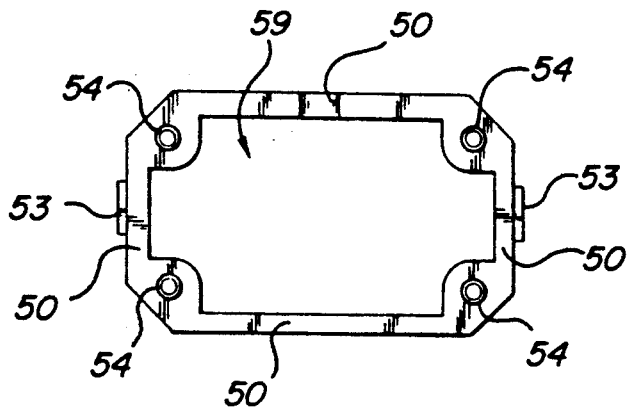
FIGS. 4 and 5 are detail views of a frame member employed in the invention junction box.
Figure 5:
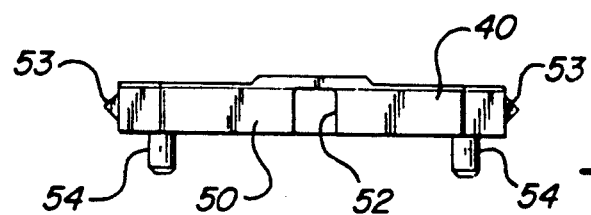

Frame member 40 is formed of plastic and, as shown in FIGS. 4, 5, and 10, has a rectangular enclosing border configuration defined by four side walls 50. One side wall 50 has a notch 52 therethrough to pass cable 20. A post 54 is provided near each corner of the frame member. Post 54 extends through respective apertures 56 in plastic sheet 34, border 25, and plastic sheet 23 and pass through respective apertures 48 in the anchor plate 38.

The posts are then orbitally welded such that they are deformed and fill the embossment cavities 58 on the remote or underside of the anchor plate 38 to lock the frame member and anchor plate to upper and lower faces of solar panel 27. Frame member 40 is positioned against the upper face of weather resistant sheet 34. Sheet 34, made from Tefzel TM, comprises a non-stick material and thus is not amenable to adhesives securement of objects thereto.

Frame member 40 is positioned such that terminals 30 and 32 are positioned below and within the hollow area 59 defined by the side walls 50 of the frame 40. After the electric cable 20 has its positive and negative leads 60 and 61 soldered to terminals 30 and 32 and the frame 40 is anchored to anchor plate 38, hollow area 59 within frame member 50 is filled with a sealant or potting material such as liquid epoxy 62, to seal the terminals 30 and 32 therein, and the epoxy 62 is allowed to set. To resist adhesion, the Tefzel TM layer 34 is scuffed within area 59. A cushioning back layer 63 is then mounted at the back of the solar panel 27 to conceal plate 38 and to provide a degree of protection against sharp objects. The back layer 63 is then stitched in place to border 25 with a peripheral edging 64 having a U-shaped cross section.

Figure 6:
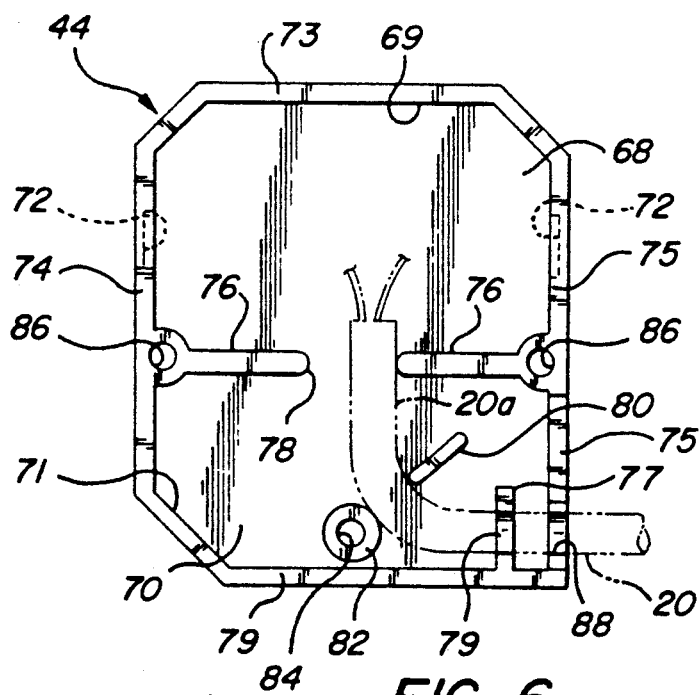
FIGS. 6 and 7 are detail views of an upper case member employed in the invention junction box.
Figure 7:
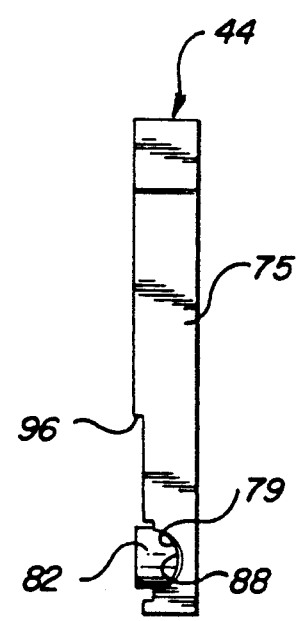
Figure 15:
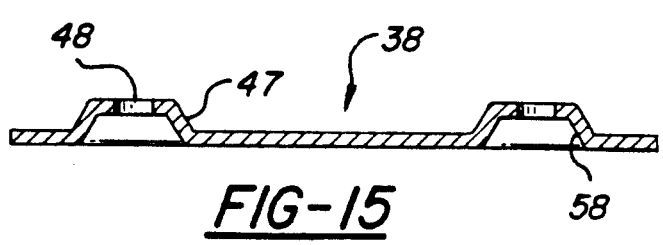
FIG. 15 is a cross sectional view of an anchor plate employed in the invention junction box.
Figure 11:
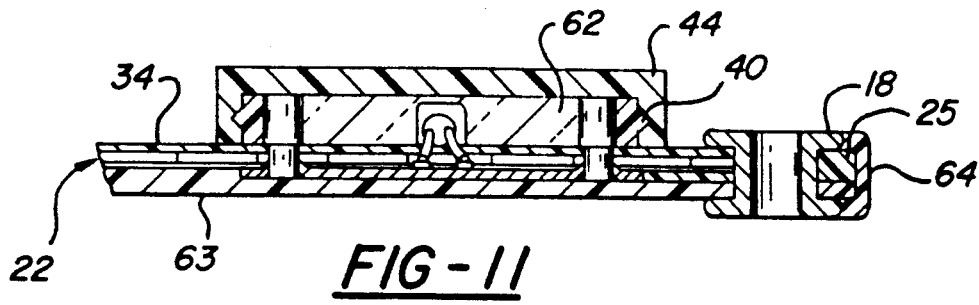
FIG. 11 is a cross sectional view taken on lines 11—11 of FIG. 3.
Figure 12:
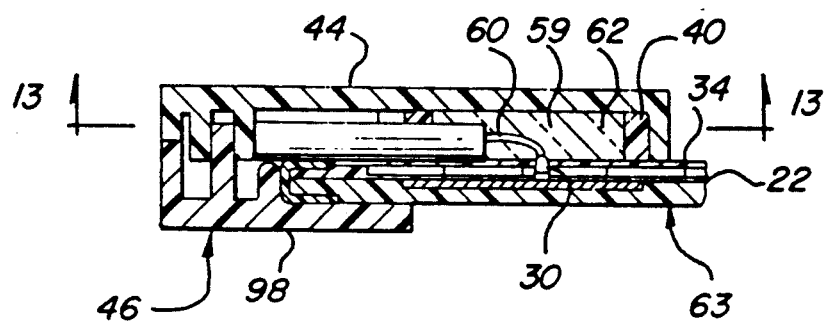
FIG. 12 is a cross sectional view taken on lines 12—12 of FIG. 3.
Figure 13:
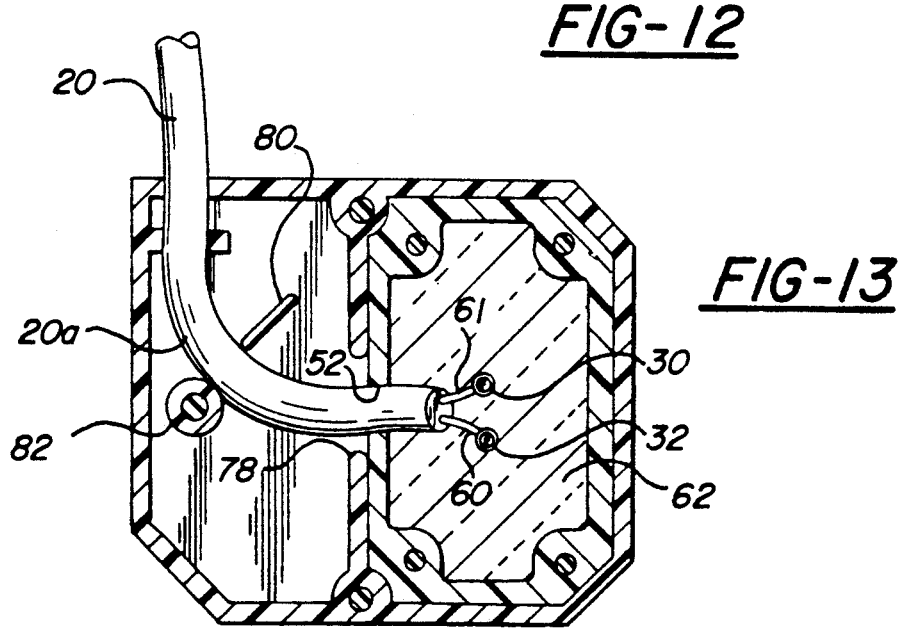
FIG. 13 is a cross sectional view taken on lines 13—13 of FIG. 12.

Case 42 is now mounted in position. Upper case member 44 is formed of plastic and, as shown in FIGS. 6 and 7, has a frame receiving portion 68 defining a downwardly opening hollow 69 and a cable tension relieving portion 70 defining a downwardly opening hollow 71. The frame receiving portion 68 has side recesses 72 which snappingly engage protrusions 53 on frame member side walls 50 to mount the frame member in the downwardly opening hollow 69 defined by portion 68 with the side walls 73, 74, 75, and 76 of case section 44 generally contiguous to the respective side walls 50 of frame member 40. Side walls 76 define a notch 78 therebetween which is aligned with notch 52 of frame member 40 to allow cable 20 to pass therethrough. An integral angled positioning partition 80 is provided in the tension relieving portion 70. Wall 80 is spaced from a hollow circular post 82 by a distance generally corresponding to the diameter of cable 20. Post 82 defines a peg receptacle hole 84 therein and two other peg receptacle holes 86 are defined at the respective outboard ends of separating walls 76. A cable engaging partition 77 extends in inwardly from outer wall 79 within hollow 71 in parallel spaced relation to outer wall 75. Partition 77 has a contoured semicircular seat 79 that snugly engages cable 20. A similar contoured semicircular seat 88 is provided in side wall 75 in alignment with contoured seat 81.

Figure 8:
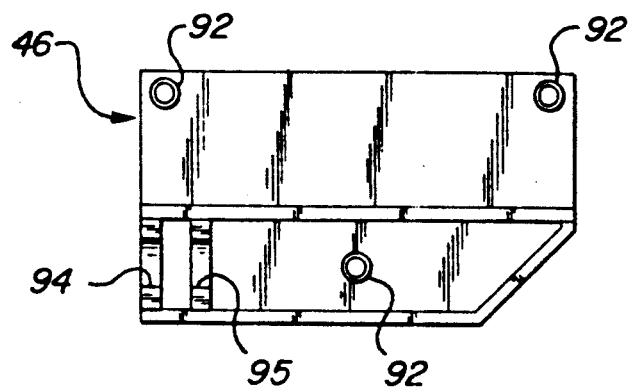
FIGS. 8 and 9 are detail views of a bottom case member employed in the invention junction box.
Figure 9:
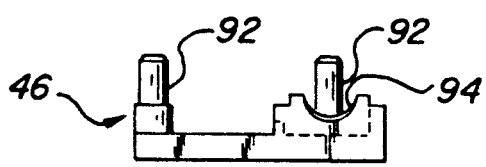

Lower case member 46 is formed of plastic and, as shown in FIGS. 8 and 9, defines three upwardly extending pegs 92 sized to be respectively snap fittingly received in receptacle holes 84,86 of upper case member 44. Case member 46 further defines semicircular seats 94 and 95. Seat 94 coacts with seat 88 of upper case member 44 to define a circular opening to pass and constrain cable 20 and seat 95 coacts with seat 79 of upper case member 44 to define a further circular opening within space 71 to further pass and constrain cable 20.

Figure 14:
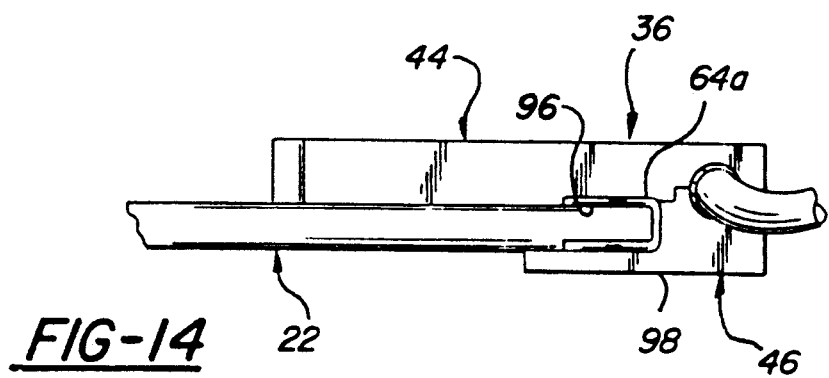
FIG. 14 is a side elevational view of an assembled junction box.

As shown in FIG. 14, upper case member 44 has a notch 96 to receive the upper flange portion 64a of edging 64. The lower outer surface 98 of lower case member 46 is substantially flush with backing 63 defining the undersurface of the solar panel so that the panel may lie substantially flush and flat on a supporting surface.

Cable 20 extends from leads 60,62 secured to terminals 30–32; passes through aligned openings 52 and 78 in frame member 50 and upper case member 46 into the tension relieving portion 70 of upper case member 46; passes via a 90 degree turn portion 20a between partition 80 and post 82; and extends out of the junction box through the circular openings defined by coacting seats 79,95 and 88,94. Any pulling or tension exerted on the cable exteriorly of the junction box will result in the cable portion 20a engaging the end of partition 80 to prevent the tension from being transferred to the soldered joints at terminals 30,32. Epoxy 62 within frame member 40 seals the terminals from any salt water or other contaminants that might corrode the terminals, and precludes the seepage of contaminants between the protective plastic layers that might act to corrode the photovoltaic sheet 22. Epoxy 62 further acts to prevent tension forces applied to the cable from reaching cables 30,32.

In this fashion, a durable junction box is provided for a solar panel which prevents the associated electric cable from being pulled from the soldered terminals of the panel; which provides for weather proofing of the terminals; and which provides a low profile to facilitate flush mounting of the solar panel on a flat surface.

Whereas a preferred embodiment of the invention has been illustrated and described in detail, it will be apparent that various changes may be made in the disclosed embodiment without departing from the scope or spirit of the invention. For example, although the invention solar panel assembly has been illustrated and described in the context of charging a battery on a sailboat, it will be obvious that the invention solar panel assembly may be used in any situation where a convenient and inexpensive source of electric energy is required.

I claim:

1. A junction box for use in establishing electric connection between an electric cable and output terminals of a solar panel located proximate one edge of the panel, said box comprising first and second separate box members adapted to respectively engage opposite faces of the panel proximate said one edge with the panel edge sandwiched therebetween and coacting when so engaged to define a passage through the box extending from an opening in the exterior of the box, sized to pass the electric cable, to a location proximate the panel terminals, said box members coacting with the panel when engaged with the panel to seal the passage except for said opening.

2. A box according to claim 1 wherein one of said members includes a plurality of posts and the other of said members includes a corresponding plurality of receptors sized to snappingly receive said posts, and said posts pass through holes in the solar panel for coaction with said receptors to snappingly secure the members against opposite faces of the panel.

3. A box according to claim 1 wherein the box further includes potting material filling a portion of said passage proximate the panel terminals and adapted to encase the portion of the cable proximate the terminals.

4. A junction box for use in establishing electric connection between an electric cable and output terminals of a solar panel located proximate one edge of the panel, said box comprising first and second box members adapted to engage opposite faces of the panel proximate said one edge with the panel edge sandwiched therebetween and coacting when so engaged to define a passage through the box extending from an opening in the exterior of the box, sized to pass the electric cable, to a location proximate the panel terminals, the box further including potting material filling a portion of said passage proximate the panel terminals and adapted to encase the portion of the cable proximate the terminals, said second box member engaging the lower face of the solar panel; said first box member engaging the upper face of the panel and defining a downwardly opening hollow overlying the panel terminals, said box further including a frame member having an enclosing border configuration and sized to fit within said hollow, and said epoxy filling the area overlying said terminals enclosed by said frame member.

5. A box according to claim 4 wherein said box further includes an anchor plate, said frame member and said anchor plate have coacting means for securing the frame member to the anchor plate with the frame member overlying the terminals and the anchor plate underlying the terminals.

6. A box according to claim 5 wherein said coacting means comprises downwardly extending posts on said frame member passing through apertures in said anchor plate.

7. A junction box for shielding the connection of an electric cable to output terminals of a solar panel positioned proximate an end edge portion of the solar panel, said junction box comprising:
   a first case member;
   a frame member, having an enclosing border configuration, received within said first case member and positioned against one face of the edge portion of the solar panel in overlying, surrounding relation to the output terminals of the solar panel;
   an anchor plate positioned against an opposite face of the edge portion of the solar panel and secured to said frame member;
   a second case member positioned against said opposite face of the edge portion of the solar panel and secured to said first case member to clamp the edge portion of the solar panel therebetween; and
   means within said case members defining an electric cable passage extending from a location exteriorally of the junction box to a location within said frame member in overlying proximity to the terminals.

8. A junction box according to claim 7 wherein one of said first and second case members includes a tension relief device adapted to engage the electric cable and operative to preclude tension exerted on the electric cable exteriorly of the junction box from being transferred to the end of the cable connected to the terminals.

9. A junction box according to claim 8 wherein
   one of said frame member and said anchor plate has posts that extend through the solar panel; and
   the other of said frame member and said anchor plate has receptors to receive said posts and thereby lock said frame member and said anchor plate together with the solar panel sandwiched therebetween.

10. A junction box according to claim 7 wherein one of said first and second case members has posts extending through the solar panel and the other of said first and second case members has receptors to receive said posts and thereby lock said first and second case members together with the solar panel sandwiched therebetween.

11. A junction box according to claim 7 wherein said first and second case members are coactingly configured to define an aperture for passage of the electric cable and are further coactingly configured to receive the end edge of the edge portion of the solar panel therebetween.

12. A low profile junction box for a flat solar panel having output terminals characterized in that the junction box includes first and second separate case members clamped about the flat solar panel; the junction box has a combined height transverse to the plane of the solar panel that is substantially less than the length of the junction box measured transverse to the height of the box; and the junction box closes about the output terminals of the solar panel and defines a passage therethrough to allow an electric cable connected to the output terminals to pass through the box to a location outside of the box, said case members coacting with said panel when clamped about the panel to seal the passage except for said opening.

13. A low profile junction box according to claim 12 wherein the first case member contains a sealant that is adapted to be placed over the electric connection of the electric cable to the output terminals.

14. A low profile junction box according to claim 13 wherein the box further includes a frame member, having an enclosing border configuration, mounted within the first case member for containing the sealant therein and the frame member is connected to an anchor plate positioned on an opposite side of the solar panel from the frame member.

15. A low profile junction box according to claim 12 wherein one of said first and second case members has a plurality of posts and the other of said first and second case members has a plurality of receivers for lockingly engaging the posts to clamp the first and second case members against opposite sides of the solar panel.

16. A low profile junction box according to claim 15 wherein the first and second case members have side walls that are coacting configured to accommodate an end edge portion of the solar panel therebetween.

17. A low profile junction box according to claim 12 wherein said case members define a tension relief device adapted to engage the electric cable and operative to preclude tension exerted on the cable outside of the junction box from being transferred to the end of the cable connected to the solar panel terminals.

18. A junction box according to claim 17 wherein said tension relief device includes means dividing said cable passage into first and second portions extending substantially at right angles to each other and means adapted to engage the cable at the turn in the cable between said first and second cable portions and operative to preclude the transfer of tension forces exerted on the first portion to the second portion.

19. A junction box for connecting the output terminals of a solar panel to an electric cable, said junction box comprising:
  an anchor plate positionable on one side of the solar panel;
  a frame member having an enclosing border configuration positionable on another side of the solar panel in opposition to said anchor plate;
  means for affixing said frame member to said anchor plate with said solar panel sandwiched therebetween and with said frame member positioned in surrounding relation to the output terminals of the solar panel;
  said frame member being constructed to retain a water sealing potting material therebetween that is adapted to encase the end of an electric cable connected to the output terminals of the solar panel; and
  said frame having a passage in the border thereof to allow the electric cable to pass therethrough for connection to the output terminals of the solar panel.

20. A method of establishing a sealed connection between a solar panel having output terminals and an electric cable comprising the steps of:
  connecting one end of the cable to the output terminals;
  potting said one cable end in a quantity of potting material overlying and sealing said terminals; and
  positioning a junction box over the potting material with the electric cable extending out of the junction box through an aperture in the junction box.

21. A method according to claim 20 wherein said potting step comprises placing a frame member having an enclosing border configuration over said output terminals with said one end of said cable extending into the area enclosed by the frame member for connection to the output terminals and placing said potting material within said frame member in surrounding relation to said one cable end.

22. A method according to claim 21 wherein said potting step further comprises placing an anchor plate beneath said output terminals and coupling said frame member to said anchor plate by coupling means passing through the solar panel in surrounding relation to said output terminals.

* * * * *